United States Patent
Whatley et al.

(10) Patent No.: US 12,418,991 B1
(45) Date of Patent: *Sep. 16, 2025

(54) METHOD TO MANUFACTURE POTTED ELECTRONIC ASSEMBLIES FOR EXTREME MECHANICAL AND THERMAL ENVIRONMENTS

(71) Applicant: General Atomics, San Diego, CA (US)

(72) Inventors: Walter J. Whatley, San Diego, CA (US); Noel Martinez, Vista, CA (US); Clay S. Staley, Murphy, TX (US)

(73) Assignee: General Atomics, San Diego, CA (US)

( * ) Notice: Subject to any disclaimer, the term of this patent is extended or adjusted under 35 U.S.C. 154(b) by 591 days.

This patent is subject to a terminal disclaimer.

(21) Appl. No.: 17/847,173

(22) Filed: Jun. 23, 2022

Related U.S. Application Data (63) Continuation of application No. 16/844,659, filed on Apr. 9, 2020, now Pat. No. 11,395,414.

(51) Int. Cl.
  *H05K 3/28* (2006.01)
  *H05K 3/24* (2006.01)
  *H05K 3/32* (2006.01)

(52) U.S. Cl.
  CPC .............. *H05K 3/285* (2013.01); *H05K 3/24* (2013.01); *H05K 3/284* (2013.01); *H05K 3/325* (2013.01)

(58) Field of Classification Search
  CPC .. H05K 1/144; H05K 1/147; H05K 2201/042; H05K 2201/068; H05K 2203/1316; H05K 2203/1327; H05K 3/24; H05K 3/284; H05K 3/285; H05K 3/325
  See application file for complete search history.

(56) References Cited

U.S. PATENT DOCUMENTS

| | | |
|---|---|---|
| H1245 H | 10/1993 | Griswold |
| 5,317,914 A | 6/1994 | Franco, Jr. |
| 5,381,304 A | 1/1995 | Theroux |
| 6,664,318 B1 | 12/2003 | Bymark |

(Continued)

FOREIGN PATENT DOCUMENTS

| | | | |
|---|---|---|---|
| DE | 102006019250 A1 * | 10/2007 | ............ B60T 8/3675 |
| WO | 2005064262 | 7/2005 | |

OTHER PUBLICATIONS

USPTO; Non-Final Office Action issued in U.S. Appl. No. 16/844,659 mailed Dec. 15, 2021.

(Continued)

*Primary Examiner* — Minh N Trinh
(74) *Attorney, Agent, or Firm* — Fitch, Even, Tabin & Flannery LLP (57) ABSTRACT

A method for manufacturing potted electronic assemblies are described. Embodiments of the method and system may provide a potting compound having a first coefficient of thermal expansion different from a second coefficient of thermal expansion for a circuit board, provide a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, and apply the fiber reinforcement and the potting compound to the circuit board.

19 Claims, 7 Drawing Sheets

(56) References Cited

U.S. PATENT DOCUMENTS

| | | |
|---|---|---|
| 6,744,637 B2 | 6/2004 | Blazic |
| 7,475,637 B2 | 1/2009 | Rastegar |
| 8,458,899 B2 | 6/2013 | Mitchell |
| 8,640,619 B1 | 2/2014 | Dimke |
| 9,860,992 B1 | 1/2018 | Chao |
| 10,188,001 B2 * | 1/2019 | Thomas ................ H05K 3/429 |
| 10,362,692 B2 | 7/2019 | Lv |
| 11,395,414 B1 | 7/2022 | Whatley |
| 2007/0139044 A1 | 6/2007 | Lamb |
| 2008/0036075 A1 | 2/2008 | Taylor |
| 2009/0004557 A1 | 1/2009 | Lasarov |
| 2011/0229702 A1 | 9/2011 | Aizpuru |
| 2018/0352666 A1 | 12/2018 | Liskow |

OTHER PUBLICATIONS

USPTO; Notice of Allowance issued in U.S. Appl. No. 16/844,659 mailed Mar. 29, 2022.
USPTO; Restriction Requirement issued in U.S. Appl. No. 16/844,659 mailed Aug. 2, 2021.
Whatley, et al.; U.S. Appl. No. 16/844,659, filed Apr. 9, 2020.

* cited by examiner

FIG. 7

METHOD TO MANUFACTURE POTTED ELECTRONIC ASSEMBLIES FOR EXTREME MECHANICAL AND THERMAL ENVIRONMENTS

This application is a continuation of U.S. application Ser. No. 16/844,659, filed Apr. 9, 2020, for METHOD TO MANUFACTURE POTTED ELECTRONIC ASSEMBLIES FOR EXTREME MECHANICAL AND THERMAL ENVIRONMENTS, now U.S. Pat. No. 11,395,414, which is incorporated in its entirety herein by reference.

BACKGROUND OF THE INVENTION

1. Field of the Invention

Embodiments of the present disclosure relate to the method of introducing low CTE material additives into a potting, or encapsulation, process to produce hardened electronic assemblies (e.g., for use in extreme mechanical and thermal loading environments).

2. Discussion of the Related Art

Various systems and processes are known in the art for potted electronic assemblies. Materials with low viscosity, which may be suitable for fill material, may have a short pot life and high exotherm properties. Attempts to control exothermic temperatures by using non-stoichiometric mix ratios result in reduced hardness when cured. Additionally, processing can be difficult. As a result, unsuitable Coefficient of Thermal Expansion (CTE) properties may cause component failure during external thermal cycles.

Unfilled potting compounds may have high CTEs, sometimes many orders of magnitude higher than a circuit board. Due to the high CTE, generation of high stresses during temperature fluctuations is possible. Alternatively, filled potting compounds have high viscosity, making small features difficult to fill. Additionally, there is potential for fillers to be filtered out, causing voids and non-uniform properties of the cured potting compound.

Therefore, there is a need in the art for a potting compound with a low CTE (i.e., matching the CTE of an associated circuit board), a long pot life, and a low exotherm temperature.

SUMMARY

A method and system for manufacturing potted electronic assemblies are described. Embodiments of the method and system may provide a potting compound having a first coefficient of thermal expansion different from a second coefficient of thermal expansion for a circuit board, provide a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, and apply the fiber reinforcement and the potting compound to the circuit board.

A potted electronic assembly is described. Embodiments of the device may a potting compound having a first coefficient of thermal expansion different from a second coefficient of thermal expansion for a circuit board, a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, the potting compound impregnated into the fiber reinforcement, and the circuit board juxtaposed with the fiber reinforcement.

DETAILED DESCRIPTION

The present disclosure describes a process to tailor bulk coefficient of thermal expansion (CTE) of potting compounds used for mechanically hardened electronic assemblies using CTE inhibiting additive fibers during the potting process. Embodiments of the present disclosure enable the use of mechanically hardened electronic assemblies in thermal environments. Conventional potting compounds may be limited in their function due to thermal stresses.

A variety of applications, including many aerospace applications, use sensitive electronic assemblies that function after exposure to mechanical loading conditions. The aerospace applications may include gun launched munitions, missiles, and air and space flight vehicles, where mechanical loads can be high. For example, applied at varying frequencies, axial and radial acceleration magnitudes in such applications may be 1-100,000 times greater than Earth's gravity. Stresses on electronic assemblies under high loads can result in part failures, if certain protections are not designed into the parts.

In some cases, potting, or encapsulating, the electronics with a supporting compound is used to ruggedize electronic assemblies for large accelerations. Potting can be performed on a component or system level. Potting compounds may include foams, epoxies, and silicones, where candidate materials are selected depending on specific properties of an application. Potting compounds fill empty space within electronic assemblies to prevent part fractures or separation of electrically bonded interconnects. Filling the empty space may mechanically stiffen the part, relieve load stresses in printed circuit boards, and provide supplementary support to electronic components. Potting compounds may also be used for electrical insulation, to protect against moisture, and to enable thermal paths for heat sinking.

Although potting compounds can be used to mechanically harden electronic assemblies, unfilled potting materials have CTEs that can be larger than the parts in the electronic assemblies. Heating or cooling of potted electronic assemblies with unfilled potting materials can result in a differential in thermal properties of the potting material when using materials such as fiberglass, ceramic, semiconductor, and certain metals. This can lead to failures in parts due to thermal stresses. Thermal stress issues are particularly prevalent in applications using densely populated, highly interconnected, electronic assemblies that are subjected to a range of temperatures. LOW CTE filled potting compounds have higher viscosity. As a result, the potential for filler material to be filtered out during the potting process may be greater and can cause a non-uniform application of the compound, which may compromise the potting structure. The present disclosure provides for methods to modify the CTE of potting compounds to uniformly match those of the electronic assembly parts while preserving the structural benefits of the potting compound.

Embodiments of the present disclosure reduce the bulk CTE of conventional potting compounds by incorporating CTE inhibiting additive fibers into the potting matrix to produce electronic assemblies with uniform CTE. In an embodiment, calculated volume fractions of custom-shaped fiber slugs are installed adjacent to and between circuit cards during circuit card assembly. The assembly is then installed into a housing, impregnated with a low viscosity potting resin, and then cured to produce a thermo-mechanically stable electronic assembly.

The following description is not to be taken in a limiting sense, but is made merely for the purpose of describing the general principles of exemplary embodiments. The scope of the invention should be determined with reference to the claims.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments.

Figure 1:
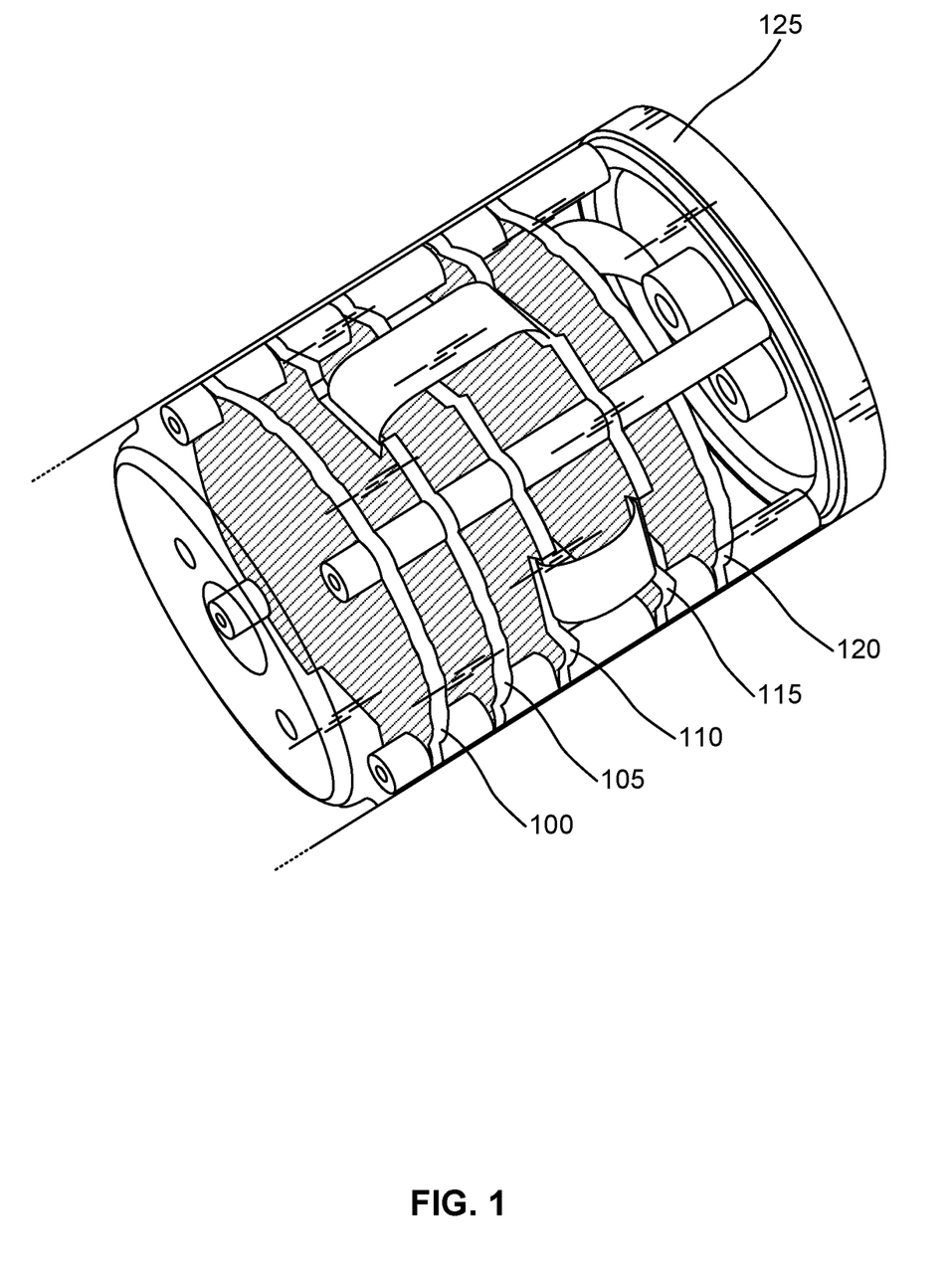
FIG. 1 shows an example of a flex circuit card electronics assembly according to aspects of the present disclosure.

FIG. 1 shows an example of a flex circuit card electronics assembly according to aspects of the present disclosure. The example shown includes several circuit boards, for example, a digital signal processor board 100, input/output peripherals 105, power conditioning circuitry 110, inertial measurement unit 115, radio transceiver 120, and structural housing 125. These circuit boards are used as examples only, and the present disclosure may be applied with any number of circuit boards. Structural housing 125 may enclose fiber reinforcement along with the circuit boards.

For example, the electronics assembly illustrated in FIG. 1 may represent a guidance electronics payload for a gun launched munition which uses a potting compound. For this application the electronics assembly is exposed to extremely high accelerations during launch. For example, acceleration can be in excess of 30,000 g's axially, and 15,000 g's radially of 1 kHz and up 15 KHz frequency respectively. Additionally, exposure to thermal environments ranges can be large. For example, ranges can be from −40 to 85 degrees C. with ramp rates exceeding 3 deg C./minute.

A potted electronic assembly may use single or multiple printed circuit boards that may be densely populated, with a variety of electronic components. The electronic components may be connected by flexible or rigid interconnects.

The electronic assemblies may be housed in a rigid s structural housing 125, which includes external electrical and mechanical connection interfaces for installation of a second body. Electronic assemblies related to the present disclosure can include GPS receivers, radios, inertial measurement units, image or RF transceiver processor systems, sensors, control actuation systems, fuses, guidance electronics, and divert and attitude control system drivers, but are not limited thereto. Given the wide variety of electronic assembly component shapes and sizes, embodiments of the present disclosure may be sufficiently adaptable to ensure utility across multiple applications.

Possible resin candidates may be determined for use in the potting process. Resin attributes for applications of non-geometry specific, high-density electronic assemblies included low viscosity, low density, low curing exotherm, temperature, high glass transition temperature, high hardness, high strength, and long pot life. For example, a 1.1 g/cm3, 82D shore hardness, 350 cp viscosity, 8-hour pot life, unfilled two part epoxy was selected as the initial candidate resin of interest. Resin properties are determined based on specific applications. For the present disclosure, a resin with an adequately low viscosity may be used to ensure robust impregnation of the additive fiber slugs.

Fiber candidates to incorporate into the resins may also be determined. Fiber geometries with long aspect ratio features may ensure a surface area for resin wetting and enable fiber property transfer to the bulk resin after impregnation. Attributes that can be considered for the fiber may be fiber CTE, electrical resistivity, cost, availability, modulus, and strength, orientation, and characteristics dimensions, CTE of the fiber filled potting matrix was calculated using Eq. 1.

$$\alpha_c = \frac{E_f \alpha_f V_f + E_m \alpha_m V_m}{E_f V_f + E_m V_m} \quad (1)$$

Where $\alpha_c$ is the CTE of the composite, $E_f$ is the elastic modulus of the fiber, $\alpha_f$ is the CTE of the fiber, $V_f$ is the volume fraction of the fiber in a given direction (assuming ⅓ of total volume fraction for randomly oriented fibers), $E_m$ is the matrix elastic modulus, $\alpha_m$ is the CTE of the matrix, and $V_m$ is the volume fraction of the matrix. In an example embodiment, 3 mm chopped Zylon fiber, with a CTE of −6 µm/m-K, and elastic modulus of 270 GPa, was selected as the initial material of interest. Fibers of varying geometries could also be used for the present disclosure.

Factors considered in incorporating CTE inhibiting additives into a potting resin matrix can include fiber integration directly into the resin base, random fiber dispersion around the circuit card assembly prior to resin flow, and the production of fiber slugs to install adjacent to and between circuit card stacks prior to resin flow, Incorporating fiber directly into the resin may not be performed due to an increase in viscosity which could lead to partial fills with voids and the possibility for fiber filtration during the fill resulting in localized non-uniformities. Dispersing fiber randomly onto the circuit card assemblies may be challenging. Controlling fiber fill volume and movement of the circuit card due to flow during resin impregnation can inhibit proper fiber dispersion. The use of fiber slugs may be an appropriate option.

Thus, according to an embodiment of the present disclosure, the potting compound has a first coefficient of thermal expansion different from a second coefficient of thermal expansion for a circuit board. A fiber reinforcement may have a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, the potting compound impregnated into the fiber reinforcement. One or more circuit boards may be juxtaposed with the fiber reinforcement.

Figure 2:
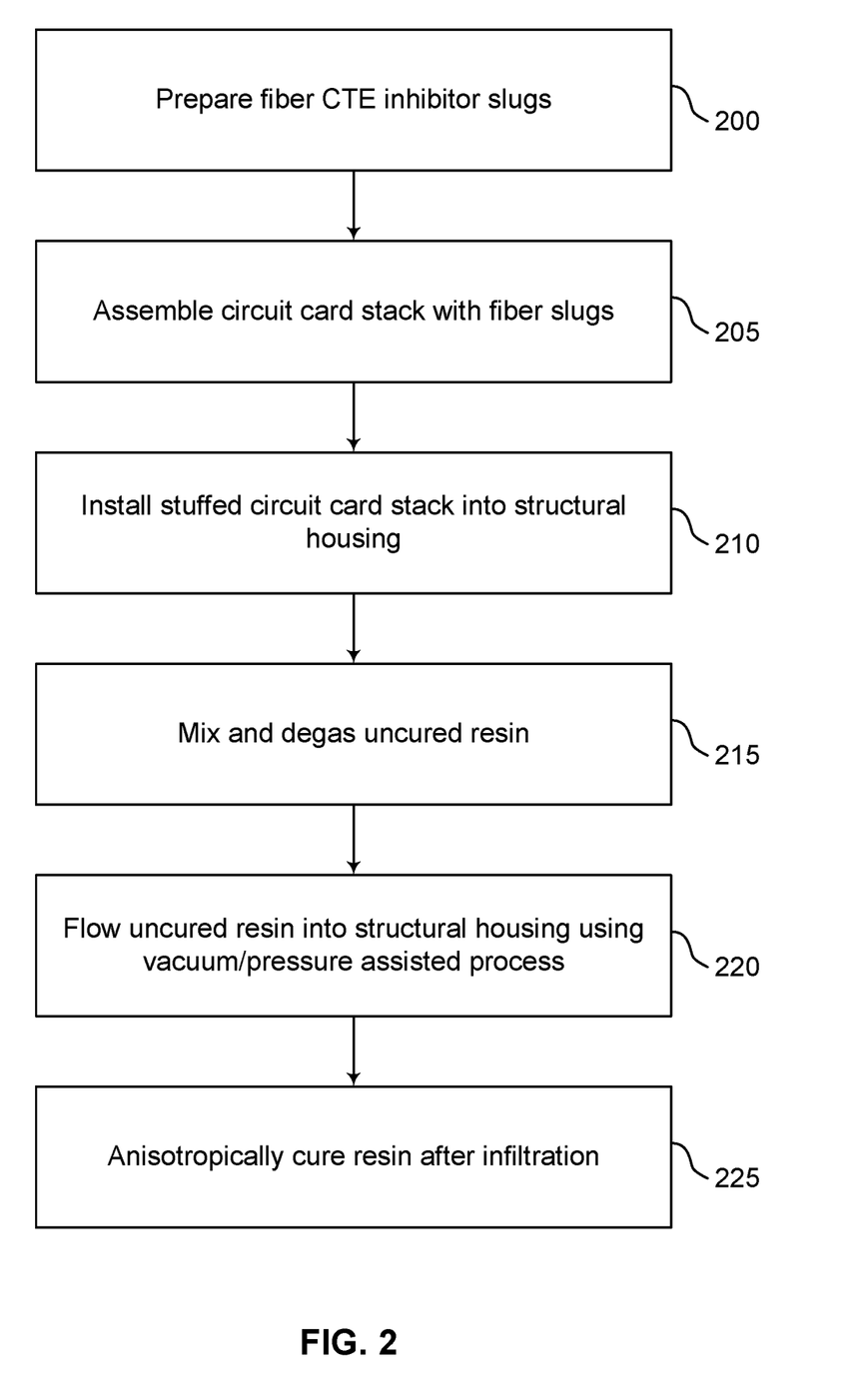
FIG. 2 shows an example of a potting process according to aspects of the present disclosure.

FIG. 2 shows an example of a potting process according to aspects of the present disclosure. In some examples, these operations may be performed by a manufacturing system (e.g., the systems described below with reference to FIGS. 3 and 7) including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 200, the system prepares fiber CTE inhibitor slugs. For example, chopped pieces of fiber (such as Zylon) are dried, weighed in accordance with a volume fill fraction target, dispersed in alcohol or other suitable solvent using ultrasonic agitation, and shaped into custom slug geometries depending on their installation location. The shaping is performed using unique molds designed from the empty space of a populated circuit card assembly.

At operation 205, the system assembles circuit card stack with fiber slugs. For example, the fiber slugs may be installed within a circuit card stack during assembly. The assembled circuit cards are then baked to evaporate the alcohol or other suitable solvent dispersion agent.

At operation 210, the system installs stuffed circuit card stack into structural housing. For example, the stuffed circuit cards may be installed in a structural housing and placed in a vacuum chamber at predetermined pressure for several hours.

At operation 215, the system mixes and degasses uncured resin. For example, a two-part resin may be thoroughly mixed and degassed in a vacuum for several minutes until no further air bubbles are observed. The two-part resin is then deposited into a reservoir for deposition.

At operation 220, the system flows uncured resin into structural housing using vacuum/pressure assisted process. For example, the mixed resin may be introduced into the electronics assembly, held at a vacuum pressure, with excess resin stored in a funnel reservoir temporarily mounted to the structural housing. The environment is then vented to atmospheric pressure to hydraulically force the resin into the electronics assembly, filling any air or vacuum voids that may be present from the initial fill. An optional step is to apply additional hydrostatic pressure over atmospheric to support resin infiltration and promote dissolution of residual gasses within the resin. Vacuum and pressure cycles can be repeated in multiple iterations to ensure proper filling of the resin.

At operation 225, the system cures resin after infiltration. For example, the electronics assembly may be anisotropically heated until the resin is fully cured. Anisotropic heating is used to ensure resin within the electronics assembly cures and shrinks to pull in uncured resin from the funnel reservoir held at a room temperature. The process yields a high quality, uniform impregnation of the electronics assembly with fiber slugs to produce thermo-mechanically stable potted electronics assemblies. If the resin used has adequately long pot-life the process can be used to pot several electronics assemblies simultaneously.

Figure 3:
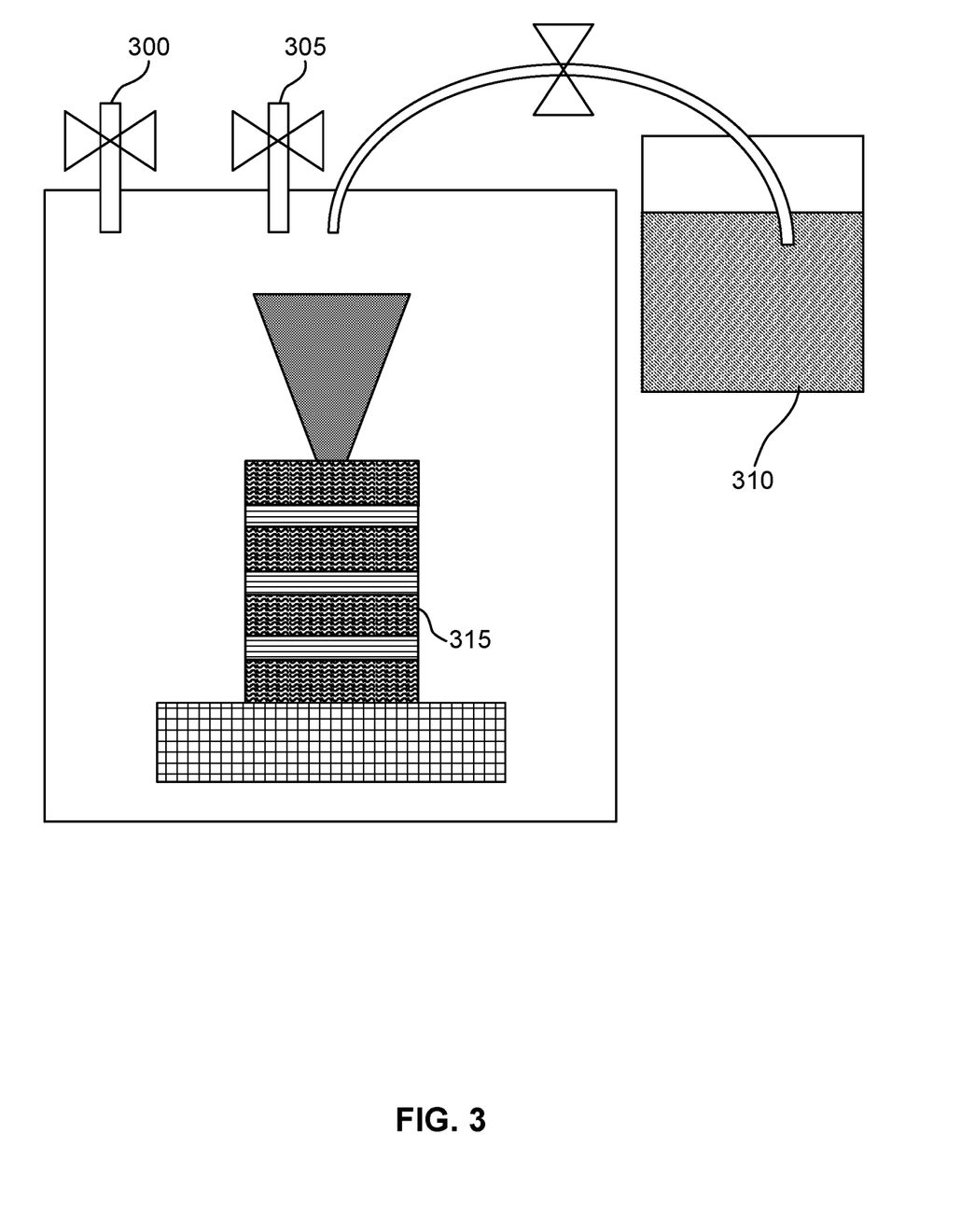
FIG. 3 shows an example of a potting process configuration according to aspects of the present disclosure.

FIG. 3 shows an example of a potting process configuration according to aspects of the present disclosure. The example shown includes vacuum 300, vent 305, resin 310, and electronics assembly 315.

Specifically, FIG. 3 illustrates a configuration of a system for producing potted electronics according to the process described above with reference to FIG. 2. The electronics assembly may, for example, be in electronics assembly of FIG. 1. In operation, the electronic assembly is placed into a vacuum chamber having the vent 305 for restoring atmospheric pressure to the vacuum chamber, and the vacuum 300 (or vacuum port) for controlling the pressure within the vacuum chamber to be either less than atmospheric pressure or above atmospheric pressure, such as by operating a pump (not shown), e.g., a vacuum pump, coupled to the vacuum 300. The resin 310 can be drawn into the vacuum chamber under the influence of pressure within the vacuum chamber that is less than, for example, atmospheric pressure (specifically, pressure that is less than the pressure in a container of the resin 310). A vacuum valve may control the vacuum 300, a vent valve may control the vent 305, and a resin valve may control the flow of the resin 310.

Figure 4:
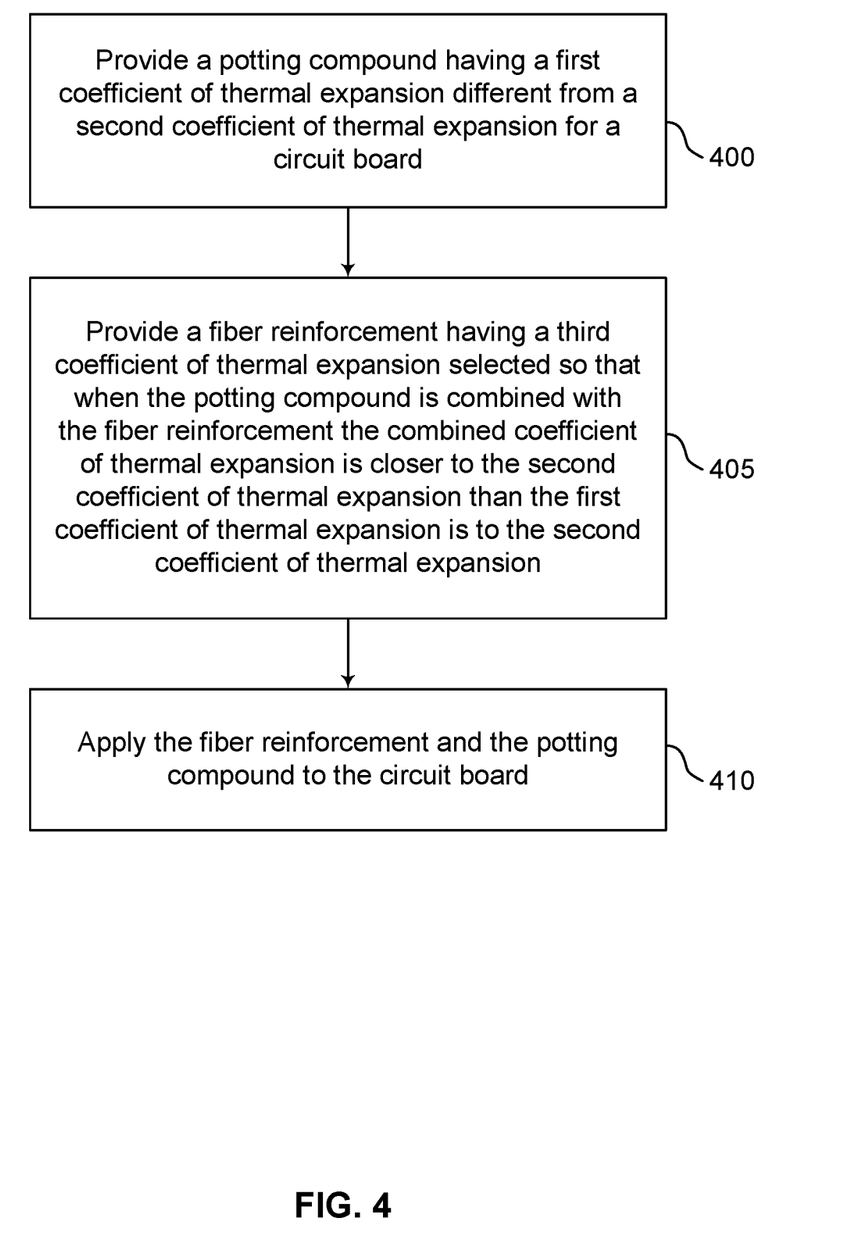
FIG. 4 shows an example of a process for manufacturing potted electronic assemblies according to aspects of the present disclosure.

FIG. 4 shows an example of a process for manufacturing potted electronic assemblies according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 400, the system provides a potting compound having a first coefficient of thermal expansion different from a second coefficient of thermal expansion for a circuit board. In some cases, the operations of this step may be performed by a potting compound component as described with reference to FIG. 7.

At operation 405, the system provides a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion. In some cases, the operations of this step may be performed by a fiber reinforcement component as described with reference to FIG. 7.

At operation 410, the system applies the fiber reinforcement and the potting compound to the circuit board. In some cases, the operations of this step may be performed by an application component as described with reference to FIG. 7.

Figure 5:
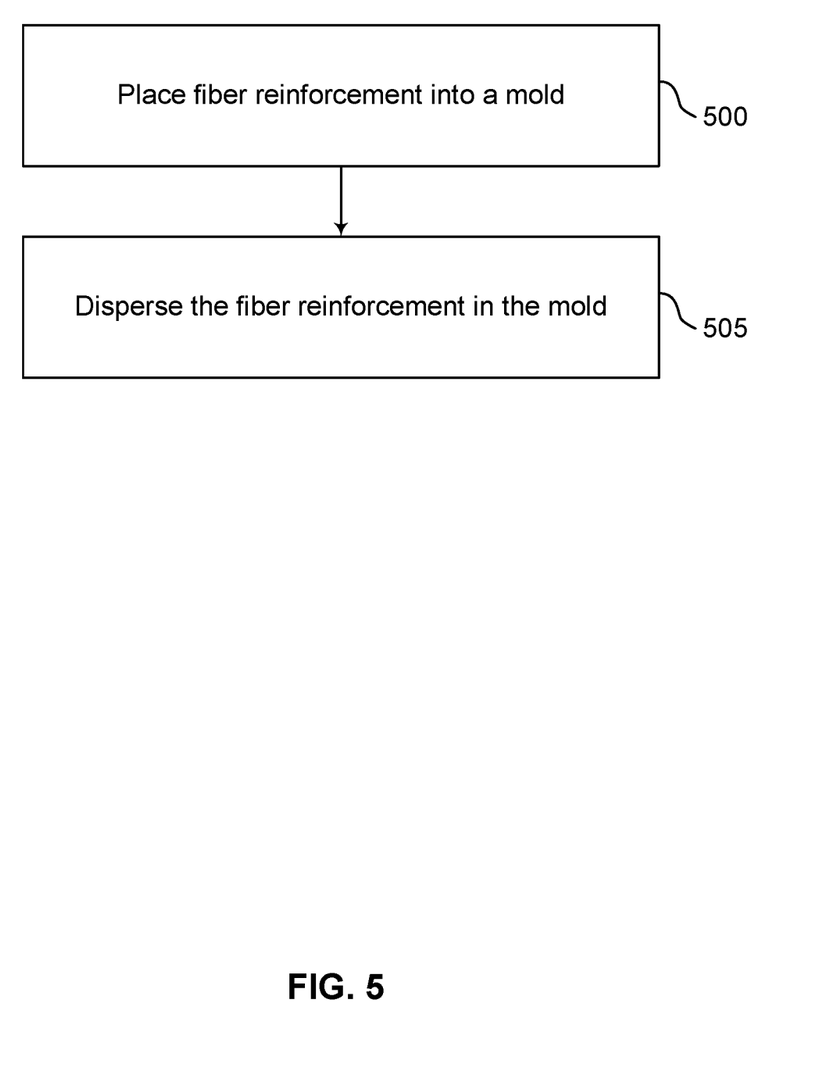
FIG. 5 shows an example of a process for providing fiber reinforcement for a potted electronic assembly according to aspects of the present disclosure.

FIG. 5 shows an example of a process for providing fiber reinforcement for a potted electronic assembly according to aspects of the present disclosure. In some examples, these operations may be performed by a system including a processor executing a set of codes to control functional elements of an apparatus. Additionally or performed using alternatively, special-purpose hardware. Generally, these operations may be performed according to the methods and processes described in accordance with aspects of the present disclosure. For example, the operations may be composed of various substeps, or may be performed in conjunction with other operations described herein.

At operation 500, system the places fiber reinforcement into a mold. In some cases, the operations of this step may be performed by a fiber reinforcement component as described with reference to FIG. 7.

At operation 505, the system disperses the fiber reinforcement in the mold. In some cases, the operations of this step may be performed by a fiber reinforcement component as described with reference to FIG. 7.

According to one embodiment, the system may ultrasonically disperse the fiber reinforcement in the mold. According to another embodiment, the system may disperse the fiber reinforcement with a sonicator probe. According to another embodiment, the system may disperse the fiber reinforcement with a rotor-stator disperser. According to another embodiment, the system may mechanically disperse the fiber reinforcement in the mold.

Figure 6:
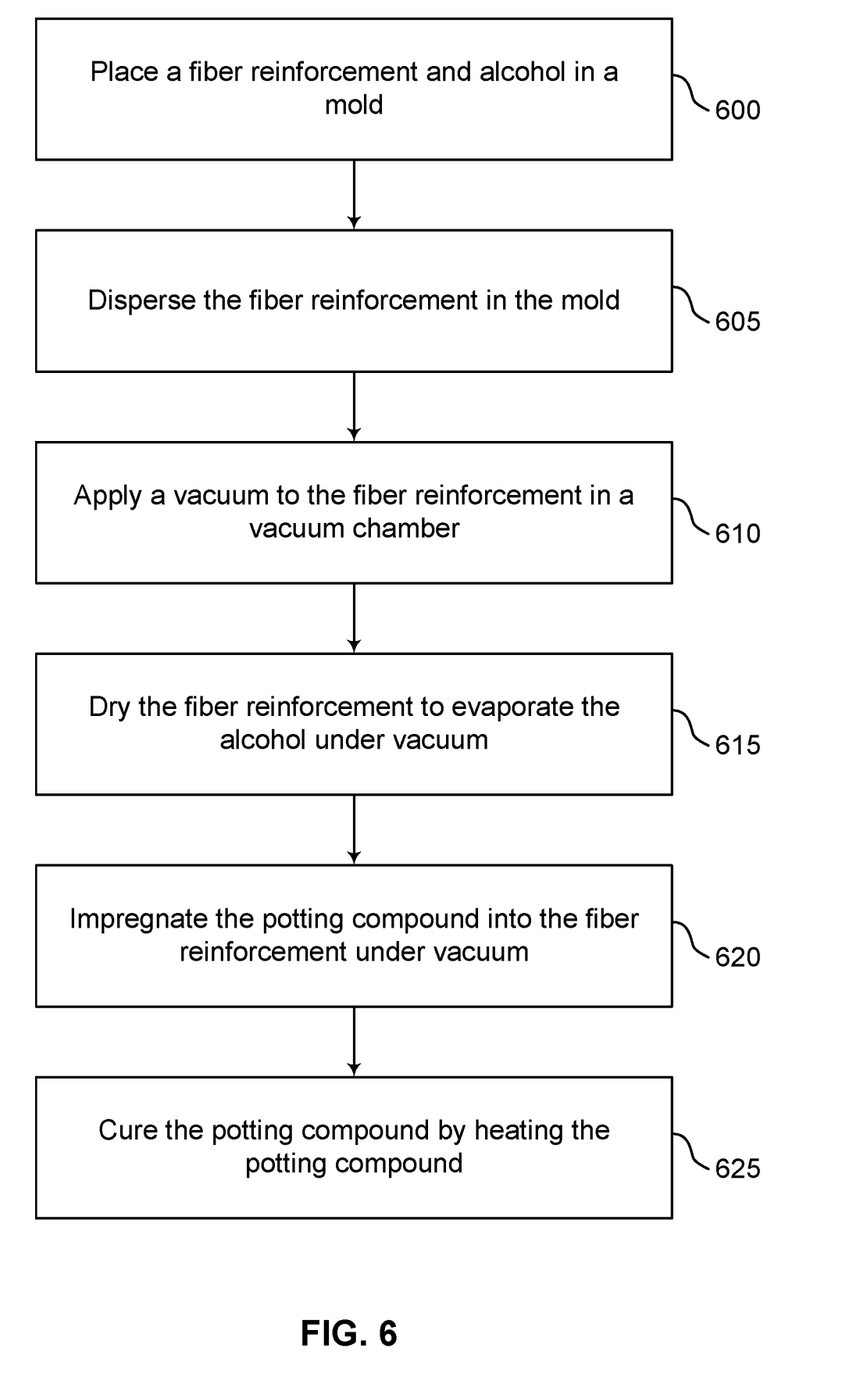
FIG. 6 shows an example of a process for manufacturing potted electronic assemblies according to aspects of the present disclosure.

FIG. 6 shows an example of a process for manufacturing potted electronic assemblies according to aspects of the present disclosure. In some examples, these operations may be performed by a system including a processor executing a set of codes to control functional elements of an apparatus. Additionally or alternatively, the processes may be performed using special-purpose hardware. Generally, these operations may be performed according to the methods and processes described in accordance with aspects of the present disclosure. For example, the operations may be composed of various substeps, or may be performed in conjunction with other operations described herein.

At operation 600, the system places a fiber reinforcement and alcohol or other suitable solvent in a mold. In some cases, the operations of this step may be performed by a fiber reinforcement component as described with reference to FIG. 7.

At operation 605, the system disperses the fiber reinforcement in the mold. In some cases, the operations of this step may be performed by a fiber reinforcement component as described with reference to FIG. 7.

At operation 610, the system applies a vacuum to the fiber reinforcement in a vacuum chamber. In some cases, the operations of this step may be performed by an application component as described with reference to FIG. 7.

t operation 615, the system dries the fiber reinforcement to evaporate the alcohol or other suitable solvent under vacuum. In some cases, the operations of this step may be performed by an application component as described with reference to FIG. 7.

At operation 620, the system impregnates the potting compound into the fiber reinforcement under vacuum. In some cases, the operations of this step may be performed by an application component as described with reference to FIG. 7.

At operation 625, the system cures the potting compound by heating the potting compound. In some cases, the operations of this step may be performed by an application component as described with reference to FIG. 7.

Figure 7:
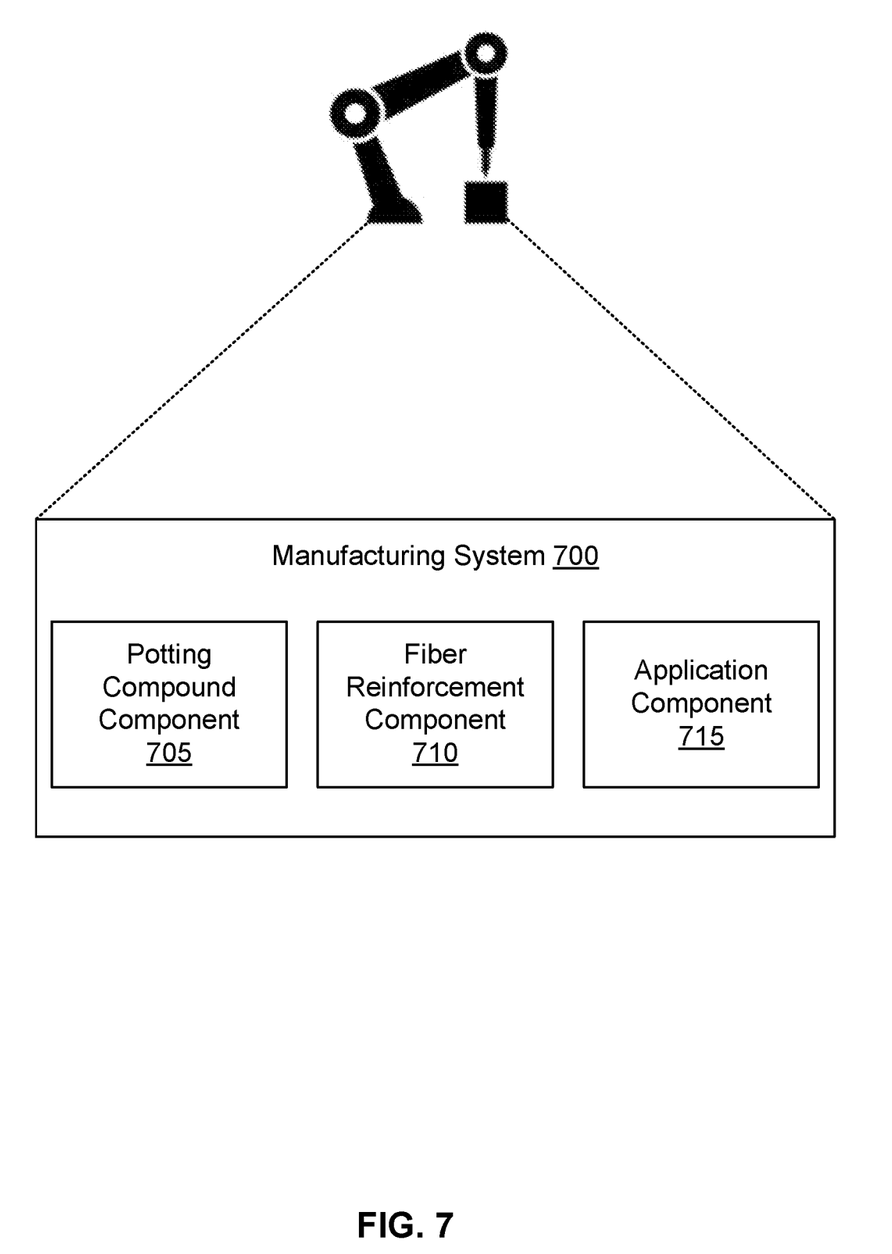
FIG. 7 shows an example of a system for manufacturing potted electronic assemblies according to aspects of the present disclosure.

FIG. 7 shows an example of a system for manufacturing potted electronic assemblies according to aspects of the present disclosure. Manufacturing system 700 may include potting compound component 705, fiber reinforcement component 710, and application component 715.

Potting compound component 705 provides a potting compound having a first coefficient of thermal expansion different from a second coefficient of thermal expansion for a circuit board.

Fiber reinforcement component 710 provides a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion.

Fiber reinforcement component 710 may also place the fiber reinforcement into a mold and disperse the fiber reinforcement in the mold. For example, fiber reinforcement component 710 may ultrasonically disperse the fiber reinforcement in the mold, disperse the fiber reinforcement with a sonicator probe, disperse the fiber reinforcement with a rotor-stator disperser, or mechanically disperse the fiber reinforcement in the mold.

In some examples, applying the fiber reinforcement and the potting compound to the circuit board includes interposing the fiber reinforcement between the circuit board, and another circuit board. Fiber reinforcement component 710 may also include alcohol or other suitable solvent in the mold.

Application component 715 applies the fiber reinforcement and the potting compound to the circuit board. In some examples, applying the fiber reinforcement and the potting compound to the circuit board includes curing the potting compound (e.g., by heating the potting compound. In some examples, the applying the fiber reinforcement and the potting compound to the circuit board includes the curing the potting compound by anisotropically heating the potting compound.

Application component 715 may also apply a vacuum to the fiber reinforcement in a vacuum chamber. Application component 715 may also dry the fiber reinforcement to evaporate the alcohol or other suitable solvent under vacuum. Application component 715 may also impregnate the potting compound into the fiber reinforcement under vacuum.

In some examples, applying the fiber reinforcement and the potting compound to the circuit board includes venting the vacuum chamber to further impregnate the potting compound into the fiber reinforcement. In some examples, applying the fiber reinforcement and the potting compound to the circuit board includes applying additional hydrostatic pressure over atmospheric pressure to the vacuum chamber to promote impregnation and reduce residual gasses.

In some examples, applying the fiber reinforcement and the potting compound to the circuit board includes applying a vacuum to the vacuum chamber after the applying additional hydrostatic pressure. In some examples, applying the fiber reinforcement and the potting compound to the circuit board includes again applying additional hydrostatic pressure over atmospheric pressure to the vacuum chamber after applying the vacuum to the vacuum chamber. In some examples, the applying the fiber reinforcement and the potting compound to the circuit board includes enclosing the circuit board and the fiber reinforcement in a structural housing.

Accordingly, the present disclosure includes the following embodiments.

A method for potted electronic assemblies is described. Embodiments of the method may include providing a potting compound having a first coefficient of thermal expansion different from a second coefficient of thermal expansion for a circuit board, providing a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, and applying the fiber reinforcement and the potting compound to the circuit board.

A system for potted electronic assemblies is described. Embodiments of the system may provide a potting compound having a first coefficient of thermal expansion different from a second coefficient of thermal expansion for a circuit board, provide a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, and apply the fiber reinforcement and the potting compound to the circuit board.

Some examples of the method and system described above may further include placing the fiber reinforcement into a mold. Some examples may further include dispersing the fiber reinforcement in the mold. Some examples of the method and system described above may further include placing the fiber reinforcement into a mold. Some examples may further include ultrasonically dispersing the fiber reinforcement in the mold.

Some examples of the method and system described above may further include placing the fiber reinforcement into a mold. Some examples may further include dispersing the fiber reinforcement with a sonicator probe. Some examples of the method and system described above may further include placing the fiber reinforcement into a mold. Some examples may further include dispersing the fiber reinforcement with a rotor-stator disperser.

Some examples of the method and system described above may further include placing the fiber reinforcement into a mold. Some examples may further include mechanically dispersing the fiber reinforcement in the mold. In some examples, the applying the fiber reinforcement and the potting compound to the circuit board includes interposing the fiber reinforcement between the circuit board, and another circuit board.

In some examples, the providing the fiber reinforcement includes placing the fiber reinforcement into a mold. In some examples, the applying the fiber reinforcement and the potting compound to the circuit board includes curing the potting compound. In some examples, the providing the fiber reinforcement includes placing the fiber reinforcement into a mold. In some examples, the applying the fiber reinforcement and the potting compound to the circuit board includes curing the potting compound by heating the potting compound.

In some examples, the applying the fiber reinforcement and the potting compound to the circuit board includes the curing the potting compound by anisotropically heating the potting compound. Some examples of the method and system described above may further include placing the fiber reinforcement and alcohol or other suitable solvent in a mold. Some examples may further include dispersing the fiber reinforcement in the mold. Some examples may further include applying a vacuum to the fiber reinforcement in a vacuum chamber. Some examples may further include drying the fiber reinforcement to evaporate the alcohol or other suitable solvent under vacuum. Some examples may further include impregnating the potting compound into the fiber reinforcement under vacuum. Some examples may further include curing the potting compound by heating the potting compound.

In some examples, the applying the fiber reinforcement and the potting compound to the circuit board includes venting the vacuum chamber to further impregnate the potting compound into the fiber reinforcement. In some examples, the applying the fiber reinforcement and the potting compound to the circuit board includes applying additional hydrostatic pressure over atmospheric pressure to the vacuum chamber to promote impregnation and reduce residual gasses.

In some examples, the applying the fiber reinforcement and the potting compound to the circuit board includes applying a vacuum to the vacuum chamber after the applying additional hydrostatic pressure. In some examples, the applying the fiber reinforcement and the potting compound to the circuit board includes again applying additional hydrostatic pressure over atmospheric pressure to the vacuum chamber after the applying the vacuum to the vacuum chamber. In some examples, the applying the fiber reinforcement and the potting compound to the circuit board includes enclosing the circuit board and the fiber reinforcement in a structural housing.

A potted electronic assembly is described. Embodiments of the device may include a potting compound having a first coefficient of thermal expansion different from a second coefficient of thermal expansion for a circuit board, a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion, the potting compound impregnated into the fiber reinforcement, and the circuit board juxtaposed with the fiber reinforcement.

Some examples of the device described above may further include another circuit board juxtaposed with the fiber reinforcement, wherein the fiber reinforcement is interposed between the circuit board and the other circuit board. Some examples of the device described above may further include a structural housing enclosing the fiber reinforcement and the circuit board.

Thus, embodiments of the present disclosure may include a method of potting an electronics assembly, which comprises the preparation of non-specific geometric and density CTE inhibiting fiber slugs with Nylon, Kevlar, quartz of various shapes and sizes, the carbon, or insertion of those fiber slugs within the negative volume defined by non-specific geometry circuit card assemblies populated with electronic components, the assembly of a circuit card stack with fiber slugs into a non-specific geometry structural housing, the hydraulic pressure assisted impregnation of the circuit card assembly within the structure housing using a resin with unfilled, low viscosity, epoxy or silicone, and the anisotropic curing of the resin.

While the invention herein disclosed has been described by means of specific embodiments, examples and applications thereof, numerous modifications and variations could be made thereto by those skilled in the art without departing from the scope of the invention set forth in the claims.

What is claimed is:
1. A method for manufacturing potted electronic assemblies, comprising:
   providing a low-viscosity resin potting compound having a first coefficient of thermal expansion different from a second coefficient of thermal expansion for a circuit board;

providing a fiber reinforcement having a third coefficient of thermal expansion selected so that when the potting compound is combined with the fiber reinforcement the combined coefficient of thermal expansion is closer to the second coefficient of thermal expansion than the first coefficient of thermal expansion is to the second coefficient of thermal expansion; and applying the fiber reinforcement and the potting compound to the circuit board.

2. The method of claim 1 comprising:
said providing said fiber reinforcement comprising:
  placing said fiber reinforcement into a mold; and
  dispersing said fiber reinforcement in the mold.

3. The method of claim 1 comprising:
said providing said fiber reinforcement comprising:
  placing said fiber reinforcement into a mold; and
  ultrasonically dispersing said fiber reinforcement in the mold.

4. The method of claim 1 comprising:
said providing said fiber reinforcement comprising:
  placing said fiber reinforcement into a mold; and
  dispersing said fiber reinforcement with a sonicator probe.

5. The method of claim 1 comprising:
said providing said fiber reinforcement comprising:
  placing said fiber reinforcement into a mold; and
  dispersing said fiber reinforcement with a rotor-stator disperser.

6. The method of claim 1 comprising:
said providing said fiber reinforcement comprising:
  placing said fiber reinforcement into a mold; and
  mechanically dispersing said fiber reinforcement in the mold.

7. The method of claim 1 comprising:
said providing said fiber reinforcement comprising:
  placing said fiber reinforcement into a mold; and
said applying the fiber reinforcement and the potting compound to the circuit board comprising:
  curing said potting compound.

8. The method of claim 1 comprising:
said providing said fiber reinforcement comprising:
  placing said fiber reinforcement into a mold; and
said applying the fiber reinforcement and the potting compound to the circuit board comprising:
  curing said potting compound by heating said potting compound.

9. The method of claim 1 comprising:
said providing said fiber reinforcement comprising:
  placing said fiber reinforcement and alcohol or other suitable solvent in a mold; and
  dispersing said fiber reinforcement in the alcohol or other suitable solvent, wherein the fiber reinforcement dispersed in the alcohol or other suitable solvent comprises a fiber slug having a molded geometry.

10. The method of claim 9 comprising:
said providing said fiber reinforcement comprising:
  after dispersing the fiber reinforcement, removing the fiber slug from the mold.

11. The method of claim 10 comprising:
said applying said fiber reinforcement and said potting compound to the circuit board comprising:
interposing the fiber slug between the circuit board and another circuit board.

12. The method of claim 11 comprising:
said applying said fiber reinforcement and said potting compound to the circuit board comprising:
  installing the fiber slug interposed between the circuit board and the another circuit board in a structural housing.

13. The method of claim 11 comprising:
said applying said fiber reinforcement and said potting compound to the circuit board comprising:
  after interposing the fiber slug, drying the fiber reinforcement by evaporating the alcohol or other suitable solvent from the fiber slug.

14. The method of claim 13 comprising:
said applying said fiber reinforcement and said potting compound to the circuit board comprising:
  impregnating said potting compound into said fiber reinforcement.

15. The method of claim 1 comprising:
said applying said fiber reinforcement and said potting compound to the circuit board comprising:
  interposing a fiber slug between the circuit board and another circuit board, wherein the fiber slug comprises a molded geometry of said fiber reinforcement dispersed in alcohol or other suitable solvent.

16. The method of claim 15 comprising:
said applying said fiber reinforcement and said potting compound to the circuit board comprising:
  after interposing the fiber slug, drying the fiber reinforcement by evaporating the alcohol or other suitable solvent from the fiber slug; and
  impregnating said potting compound into said fiber reinforcement.

17. The method of claim 16 comprising:
said impregnating said potting compound into said fiber reinforcement comprising:
  applying a vacuum to the fiber reinforcement in a vacuum chamber.

18. The method of claim 17 comprising:
said impregnating said potting compound into said fiber reinforcement comprising:
  after applying the vacuum, applying additional hydrostatic pressure over atmospheric pressure to the vacuum chamber.

19. The method of claim 18 comprising:
said impregnating said potting compound into said fiber reinforcement comprising:
  after applying the additional hydrostatic pressure, again applying the vacuum to the vacuum chamber.

* * * * *